United States Patent
Oikawa

[11] Patent Number: 5,942,778
[45] Date of Patent: Aug. 24, 1999

[54] SWITCHING TRANSISTOR AND CAPACITOR FOR MEMORY CELL

[75] Inventor: Ryuichi Oikawa, Tokyo, Japan

[73] Assignee: NEC Corporation, Tokyo, Japan

[21] Appl. No.: 08/928,078

[22] Filed: Sep. 12, 1997

Related U.S. Application Data

[63] Continuation of application No. 08/527,205, Sep. 12, 1995, abandoned.

[30] Foreign Application Priority Data

Sep. 12, 1994 [JP] Japan .................................. 6-216921

[51] Int. Cl.$^6$ ........................ H01L 27/108; H01L 29/76; H01L 29/94; H01L 31/119
[52] U.S. Cl. ........................ 257/301; 257/908; 438/246; 438/389
[58] Field of Search .................................. 257/300, 301, 257/302, 303, 304, 305, 306, 311, 908; 438/246, 389

[56] References Cited

U.S. PATENT DOCUMENTS

| 5,028,980 | 7/1991 | Teng .................................. 357/51 |
| 5,548,145 | 8/1996 | Hamamoto et al. ................. 257/301 |

FOREIGN PATENT DOCUMENTS

| 62273764 | 11/1987 | Japan .................................. 257/301 |
| 63-240061 | 10/1988 | Japan . | |
| 6-151757 | 5/1994 | Japan .................................. 257/304 |

OTHER PUBLICATIONS

Teruda et al., "A New Draw Cell with a Transistor on a Lateral Epitaxial Silicon Layer (Tole Cell)", IEEE Trans. Elec. Devices, vol. 37, No. 9, pp. 2052–2057, Sep. 1990.

Primary Examiner—Olik Chaudhuri
Assistant Examiner—Howard Weiss
Attorney, Agent, or Firm—Sughrue, Mion, Zinn, Macpeak & Seas, PLLC

[57] ABSTRACT

A semiconductor device includes (a) a first conductivity type semiconductor substrate having a plurality of trenches formed therein, the trenches defining a plurality of device regions between adjacent trenches, (b) a second conductivity type diffusion layer formed at least around an outer surface of each of the device regions, (c) an insulating film formed on the inner surface of each of the trenches to cover a part of the second conductivity type diffusion layer therewith, (d) a plate electrode formed within each of the trenches, (e) a gate electrode formed above the second conductivity type diffusion layer and (f) a gate insulating film interposed between the gate electrode and the second conductivity type diffusion layer to isolate the gate electrode from the second conductivity type diffusion layer. This semiconductor device eliminates the need for the second conductivity type diffusion layer to serve as a capacitor electrode in contact with a switching transistor. Thus, a vertical type transistor in which the control of impurities profile and gate oxide layer thickness profile is quite difficult, is not used, yet a memory cell as small as the vertical type transistor can be obtained.

9 Claims, 9 Drawing Sheets

SWITCHING TRANSISTOR AND CAPACITOR FOR MEMORY CELL

This is a Continuation of application Ser. No. 08/527,205 filed Sep. 12, 1995, now abandoned.

BACKGROUND OF THE INVENTION

1. Field of the Invention

The invention relates to a semiconductor device, and more particularly to a switching transistor and a capacitor for use in a memory cell of a dynamic random access memory (DRAM).

2. Description of the Prior Art

With a demand today for higher integration of DRAM, various attempts have been made to reduce the area of memory cells. For instance, Japanese Unexamined Patent Public Disclosure No. 63-240061 laid open on Oct. 5, 1988 has suggested a semiconductor device in which a diffusion layer capacitor electrode is formed in a trench formed with a semiconductor device to thereby provide a smaller memory cell area.

Hereinbelow will be explained the semiconductor device suggested in No. 63-240061 with reference to FIGS. 1 and 2, in which FIG. 1 is a cross-sectional view of a memory cell of DRAM, and FIG. 2 is a top plan view. As illustrated, a p-type Si substrate 24 is formed with trenches, along an inner surface of which is formed an n-type diffusion layer 25 and an oxide layer 26 over the n-type diffusion layer 25. Each of the trenches are filled with a plate electrode 23. The n-type diffusion layer 25, the oxide layer 26 and the plate electrode 23 define a cell capacitor. The cell capacitor is isolated from adjacent cell capacitors by a heavily doped p-type diffusion layer 33 formed at the bottom of each of the trenches. A switching transistor comprises a vertical type MOS field effect transistor (FET) composed of an n-type source layer 29 deposited on an exposed end portion of the n-type diffusion layer 25, a p-type channel layer 32 deposited on the n-type source layer 29, and an n-type drain layer 31 deposited on the p-type channel layer 32. These layers 29, 32, 31 are formed by selective epitaxial growth. Thus, a channel 30 extends vertically to the Si substrate 24.

As mentioned later with reference to FIG. 3D, a gate oxide layer 39 is formed along a side wall of epitaxial layers 36, 37 and 38. Writing a charge to the cell capacitor and reading a charge from the cell capacitor is carried out by applying a voltage to gate electrode 27 of the switching transistor. The epitaxial layers 29, 31 and 32 and the Si substrate 1 are covered with an interlayer insulating film 41, on which bit lines 28 extend. The bit lines 28 are in contact with associated n-type drain layers 31 through the interlayer insulating film 41. Over the bit lines 28 is deposited a passivation layer 34.

Hereinbelow will be explained a method for fabricating the above mentioned semiconductor device with reference to FIGS. 3A to 3E. First, as illustrated in FIG. 3A, the p-type Si substrate 24 is formed with a plurality of trenches (no reference numeral). Then, at the bottom of each of the trenches is formed a heavily doped p-type diffusion region serving as a channel stopper 33, and along an inner side wall of each of the trenches is formed the n-type diffusion layer 25. After the n-type diffusion layer 25 and the channel stopper 33 has been covered with the oxide layer 26, each of the trenches is filled with polysilicon by evaporation to thereby form the plate electrode 23.

Then, an oxide layer 35 is deposited all over the Si substrate 24. As illustrated in FIG. 3B, the oxide layer 35 is patterned by means of wet etching so that there are exposed only areas in which a memory cell transistor is to be formed. After preparation such as washing, the Si substrate 24 is placed into a molecular beam epitaxy (MBE) apparatus, in which a layer 36 including As, a layer 37 including B, and a layer 38 including As are epitaxially grown in this order on the substrate 24 at a substrate temperature in the range of 700 to 800 degrees centigrade.

Thus, layers 36a are selectively, epitaxially grown on the above mentioned area at which the Si substrate 24 is exposed, while the Si layer becomes a polysilicon layer on the oxide layer 35. Then, the Si substrate 24 is etched with boiled nitric acid to thereby remove only the polysilicon layer and leave the epitaxial layers 36a as they are, as illustrated in FIG. 3C. Then, as illustrated in FIG. 3D, the Si substrate 24 is oxidized to thereby form a gate oxide layer 39 on the Si substrate 24 and along side walls of the epitaxial layers 36a. Thereinafter, material for electrode formation is deposited and patterned to thereby form gate electrodes 40 along the side wall of the epitaxial layers 36a on 5 the gate oxide layer 39.

Then, as illustrated in FIG. 3E, an interlayer insulating layer 41 is deposited over the Si substrate 24 and the epitaxial layers 36a, and is flattened. Over the flattened interlayer insulating layer 41 is deposited a second interlayer insulating layer 42. Then, there are formed contact windows reaching the e-type drain layer 31 of the epitaxial layers 36a through the interlayer insulating layers 41 and 42. Then, as illustrated in FIG. 1, the bit lines 28 are formed over the second interlayer insulating layer 42. Finally, over the bit lines 28 is deposited the passivation layer 34. Thus, a memory cell as illustrated in FIG. 1 is completed.

As is obvious based on the above description with reference, in particular, to FIG. 1, in the prior art method, a memory cell transistor is formed on the n-type diffusion layer 25 serving as a capacitor electrode in a vertical arrangement, and hence there is no area in which the memory cell transistor overlaps the cell capacitor composed of the n-type diffusion layer 25, the oxide layer 26, and the plate electrode 23. Thus, it is possible to reduce the cell area, though the flatness of the Si substrate is degraded.

However, the above mentioned prior art memory cell structure for a semiconductor device poses problems with respect to its structure, fabrication technologies, and fabrication cost, as follows.

One of structural problems is that a switching transistor is stacked on a semiconductor substrate so that a channel extends perpendicularly to the semiconductor substrate. This reduces memory cell area, but at the same time degrades the flatness of the semiconductor substrate. The degradation of the flatness of the semiconductor substrate makes subsequent lithography and metallization more difficult. The degree of such difficulty is markedly increased with the reduction of the memory cell design rule.

The structural advantage of a trench capacitor cell relative to a stacked capacitor cell is that substrate flatness is not degraded because the capacitor does not have a stack-up structure but rather has a dig-down structure. However, the above mentioned prior art method and device reduces the advantage of the trench capacitor cell.

Regarding memory cell area, a bit line contact, a word line and an element isolation cannot be designed smaller than the size allowed by the design rule. Hence, even in an open bit line structure as illustrated in FIG. 2, the cell area cannot be designed to be smaller than $6F^2$ wherein F represents the design rule. In spite of an increased number of fabrication steps, the value $6F^2$ remains the same minimum size value obtained when the memory cell is composed of a flat type transistor.

In addition, in the prior art device, if the epitaxial layers are not formed precisely in a square as viewed from the top, the thickness of the gate oxide layer formed through gate oxidation becomes nonuniform because the side wall of the epitaxial layers have crystal orientations different depending on the area of the side wall. Consequently, when the memory cell transistor is driven, the channel current is concentrated to a portion having a thinner gate oxide layer than other portions, thereby reducing the reliability or life span of the gate oxide layer. Furthermore, since the substrate of the memory cell transistor is in a floating condition, it is impossible to control the substrate potential.

A problem with respect to fabrication technologies is that the alignment margin is strictly limited in the lithography step for opening windows within the oxide layer 35, on which windows the epitaxial layers 36a are to be formed (see FIG. 3B). If the window for the epitaxial layers 36a is formed out of place overlapping the trench, the source 29 of the memory cell transistor is short-circuited with the plate electrode 23, that is, the capacitor electrode is short-circuited with the plate electrode 23.

On the other hand, if the window for the epitaxial layers 36a is formed out of place closer to the device region 2, the source 29 of the memory cell transistor will not overlap an exposed portion of the n-type diffusion layer 25, and thereby the switching transistor will be isolated from the cell capacitor. Accordingly, the alignment margin in the lithography step is equal at most to half of a thickness of the n-type diffusion layer 25 formed along an inner side wall of the trench. Since the alignment is carried out not to a surface of a diffusion layer but to a thickness of a diffusion layer, it is unavoidable that the alignment margin is small.

A problem with respect to fabrication cost is in the selective growth step by means of molecular beam epitaxy. Molecular epitaxy is characterized by low temperature growth, and has relatively good controllability with respect to crystal growth speed. Hence, it is possible to provide a properly controlled epitaxial structure, if accuracy in concentration of impurities is not required. However, molecular epitaxy needs an apparatus capable of achieving an ultra-high vacuum, with the result of high apparatus cost and low throughput. In addition, the addition of a selective epitaxial growth step increases fabrication cost. Accordingly, molecular epitaxy is not suitable for DRAM fabrication requiring larger production capacity and lower cost.

Furthermore, the above mentioned difficulties in fabrication technologies decrease fabrication yield and thereby increase fabrication cost. Based on the foregoing, if a flat type transistor can be provided in much the same area as other types of transistors, it is more advantageous to compose a memory cell of a flat type transistor, so that the channel impurities profile in the cell transistor, the source/drain impurities profile, and the thickness of the gate insulating film can be readily controlled.

SUMMARY OF THE INVENTION

In view of the foregoing problems, it is an object of the present invention to provide a semiconductor device including a memory cell having a small area without deterioration of substrate flatness, which is one advantage of a trench capacitor cell, by using a flat channel type transistor whose channel structure is readily controlled.

The invention provides a semiconductor device including (a) a first conductivity type semiconductor substrate having a plurality of trenches formed therein, the trenches defining a plurality of device regions between adjacent trenches, (b) a second conductivity type diffusion layer formed at least around an outer surface of each of the device regions, (c) an insulating film formed on the inner surface of each of the trenches to cover a part of the second conductivity type diffusion layer therewith, (d) a plate electrode formed within each of the trenches, (e) a gate electrode formed above the second conductivity type diffusion layer, and (f) a gate insulating film interposed between the gate electrode and the second conductivity type diffusion layer to isolate the gate electrode from the second conductivity type diffusion layer.

The invention further provides a semiconductor device for use in a semiconductor memory, the semiconductor device including (a) a first conductivity type semiconductor substrate having a plurality of trenches formed therein, the trenches defining a plurality of device regions between adjacent trenches, (b) a second conductivity type diffusion layer formed at least around an outer surface of each of the device regions, one of the ends of the second conductivity type diffusion layer reaching a surface of the first conductivity type semiconductor substrate, (c) an insulating film formed on the inner surface of each of the trenches to cover a part of the second conductivity type diffusion layer therewith, (d) a plate electrode formed within each of the trenches, (e) a gate insulating film formed on a surface of the first conductivity type semiconductor substrate, (f) a plurality of word lines each of which extends on the gate insulating film above the second conductivity type diffusion layer, (g) a plurality of bit lines extending in a cross-direction to the word lines, and (h) a plurality of contact plugs each of which connects each of the bit lines to an associated one of the second conductivity type diffusion layers of the device regions.

In the above mentioned semiconductor device according to the invention, the second conductivity type diffusion layer constitutes a part of the trench capacitor formed in the semiconductor substrate, and on a portion of the second conductivity type diffusion layer, exposed to a surface of the semiconductor substrate, is stacked the gate insulating layer and the gate electrode on the semiconductor substrate in this order perpendicularly to the semiconductor substrate surface. Hence, there is no area, or a capacitor contact, through which the second conductivity type diffusion layer serving as a capacitor electrode is in contact with the switching transistor.

In addition, the second conductivity type diffusion layer also serves as the source of a memory cell transistor, and hence it is not necessary to form capacitor contact windows. Furthermore, all of the device region can be used as a cell capacitor.

In the semiconductor device according to the invention, since the diffusion layer for the capacitor electrode extends vertically, it is possible to decrease the dependency of the threshold voltage on a voltage difference between the substrate and the source compared to a normal flat type transistor. The decreased dependency in turn reduces the gate voltage, and hence the electric field acting on the gate insulating film is reduced.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings in which.

DESCRIPTION OF THE PREFERRED EMBODIMENTS

Figure 1:
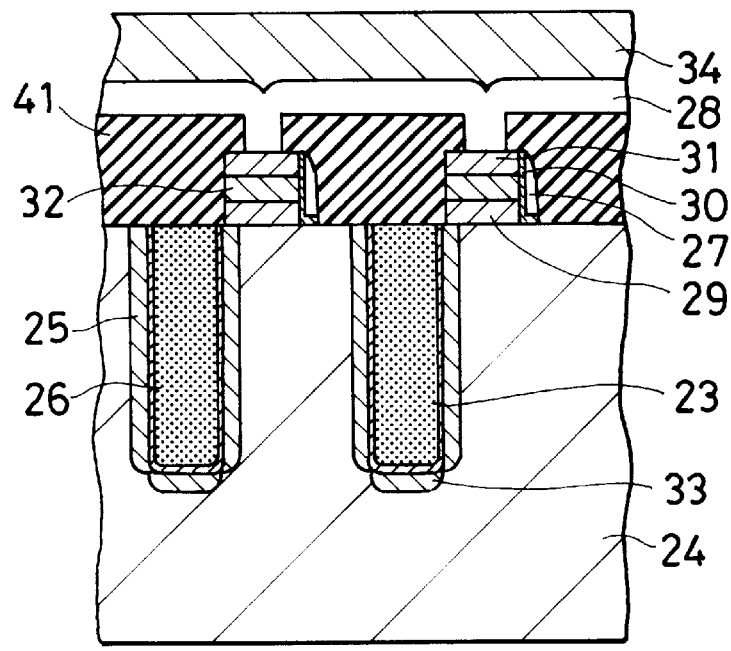
FIG. 1 is a cross-sectional view of a prior art semiconductor device.
Figure 2:
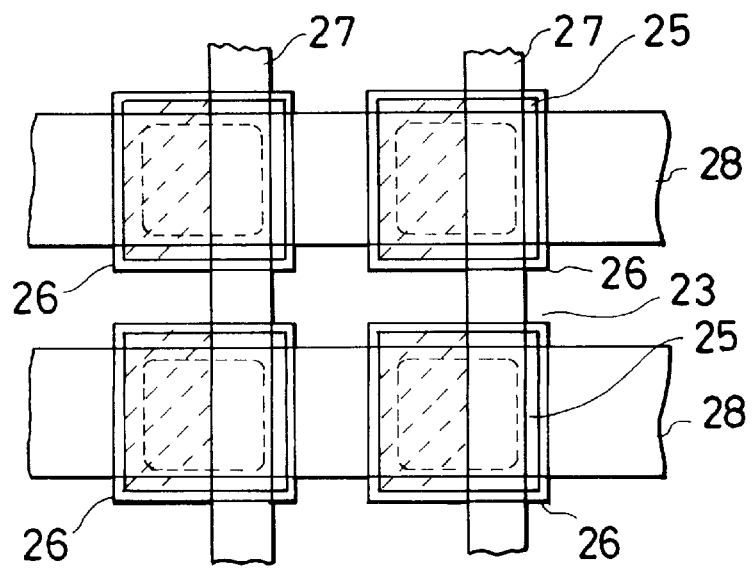
FIG. 2 is a top plan view of the semiconductor device illustrated in FIG. 1.
Figure 3A:
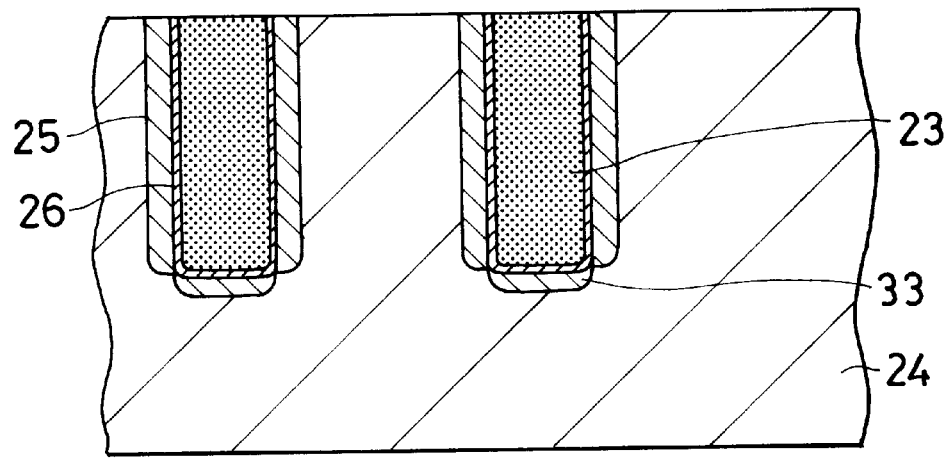
FIGS. 3A to 3E are cross-sectional views of an element in relative steps of a prior art method for fabricating a semiconductor device.
Figure 3B:
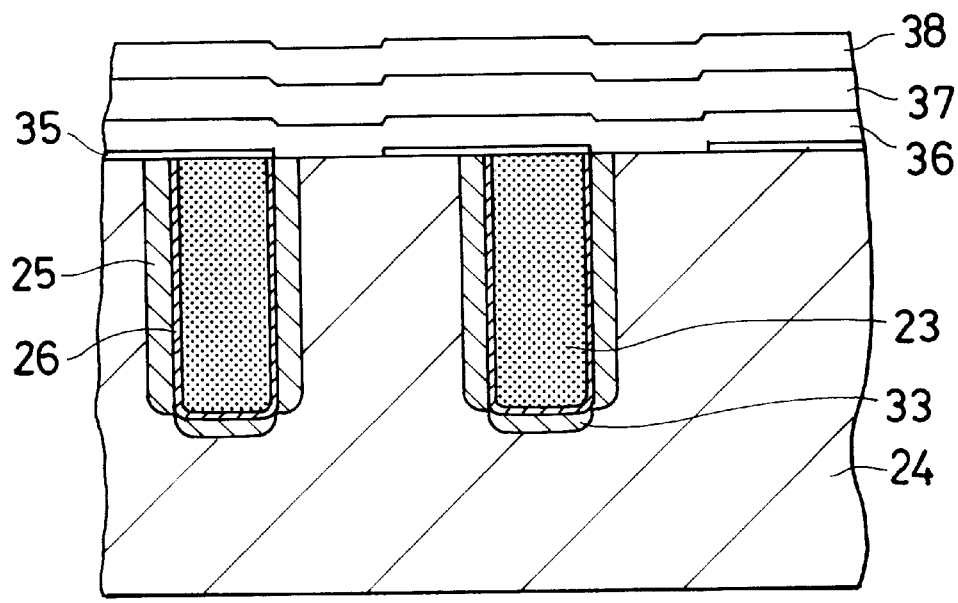
Figure 3C:
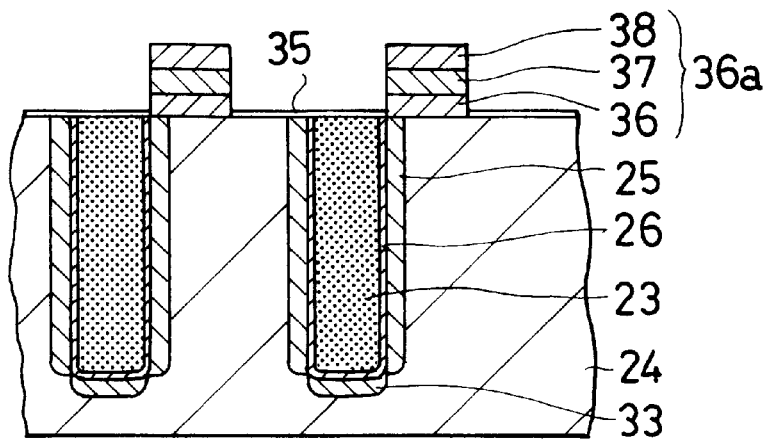
Figure 3D:
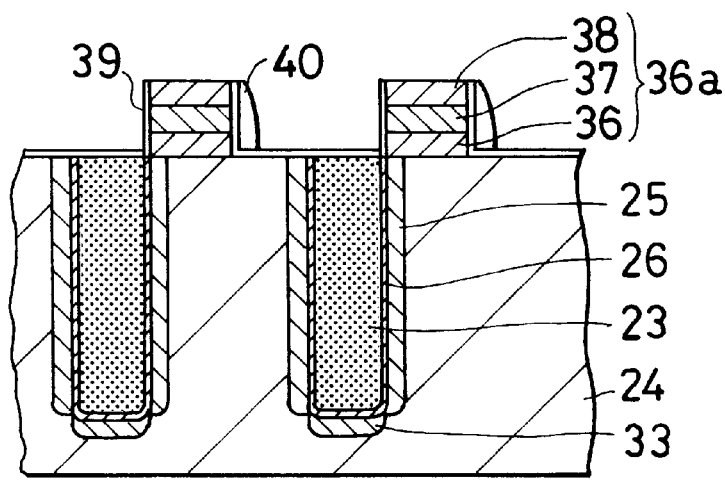
Figure 3E:
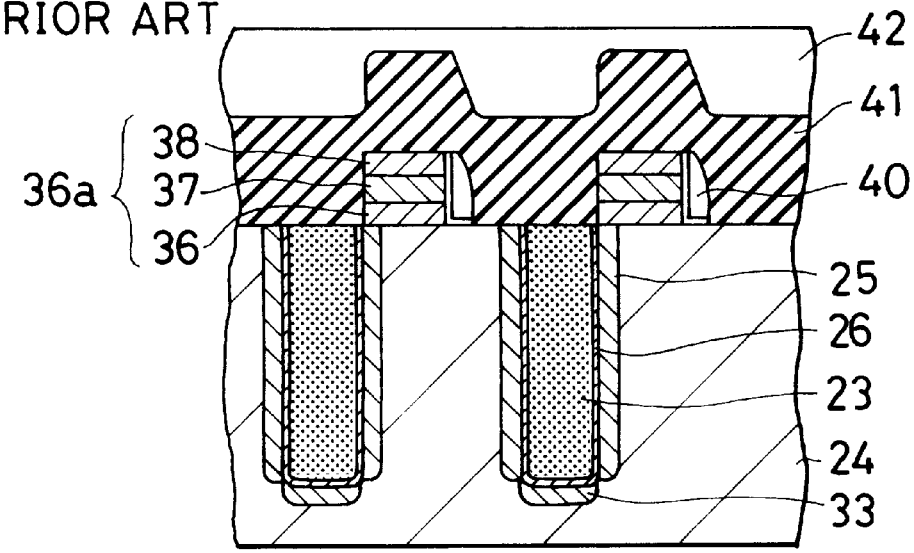

A preferred embodiment of the present invention will be explained hereinbelow with reference to FIGS. 4 to 6. The embodiment has an open bit line structure intruding a contact per a bit of DRAM memory cell.

A p-type silicon substrate 1 is formed with a plurality of trenches (no reference numeral) to define a plurality of device regions 2. At the periphery of each of the device regions 2 is formed a n-type diffusion layer 3. As illustrated in FIG. 4, on each of the device regions 2 is formed a gate oxide layer 13 having a thickness of about 8 nm. On the gate oxide layer 13 is formed a word line or a gate electrode 7 having a thickness of about 200 nm. The n-type diffusion layer 3 is connected with the capacitor diffusion layer of the memory cell transistor in self-aligning fashion. Specifically, the word lines 7 are formed on the gate oxide layer 13 so that each of the word lines 7 overlaps an end portion of the n-type diffusion layer 3 exposed on the surface of the Si substrate 1. Thus, it is unnecessary to form a capacitor contact.

Figure 5:
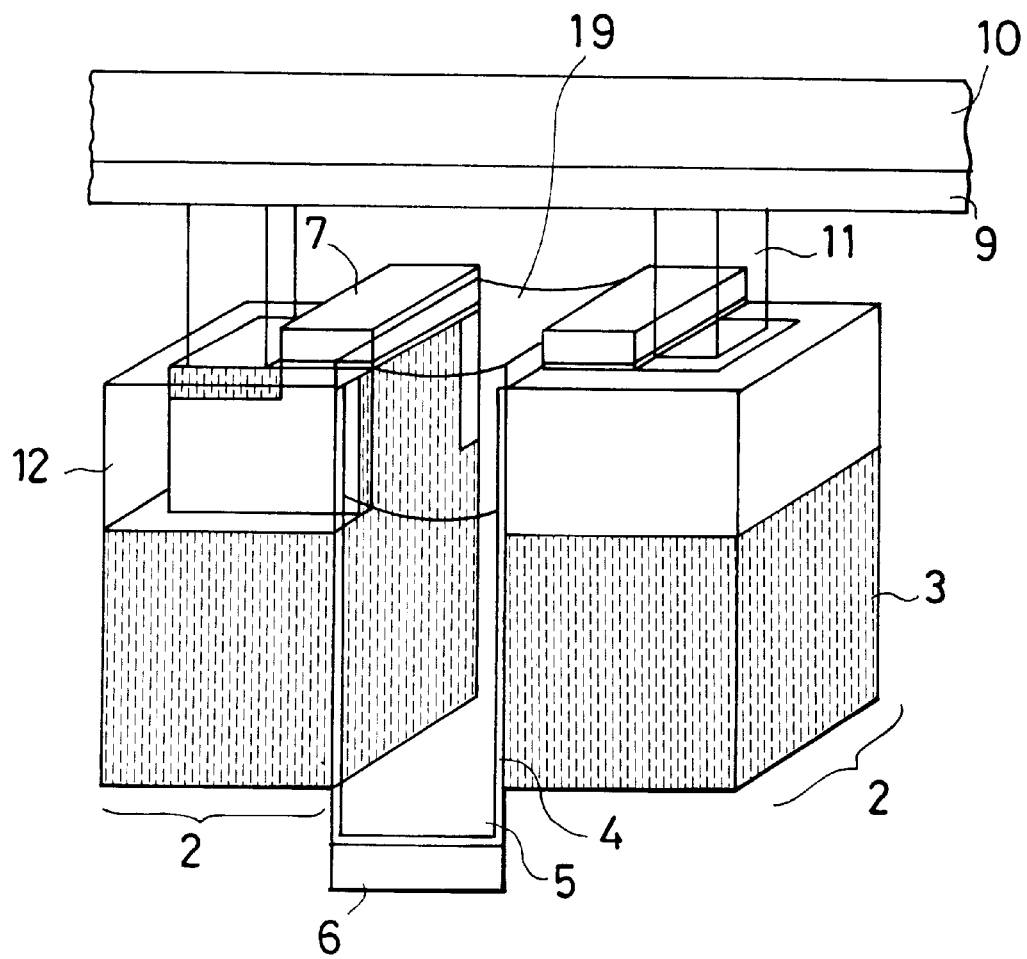
FIG. 5 is a perspective view of the memory cell array illustrated in FIG. 4 prior to formation of bit lines.
Figure 6:
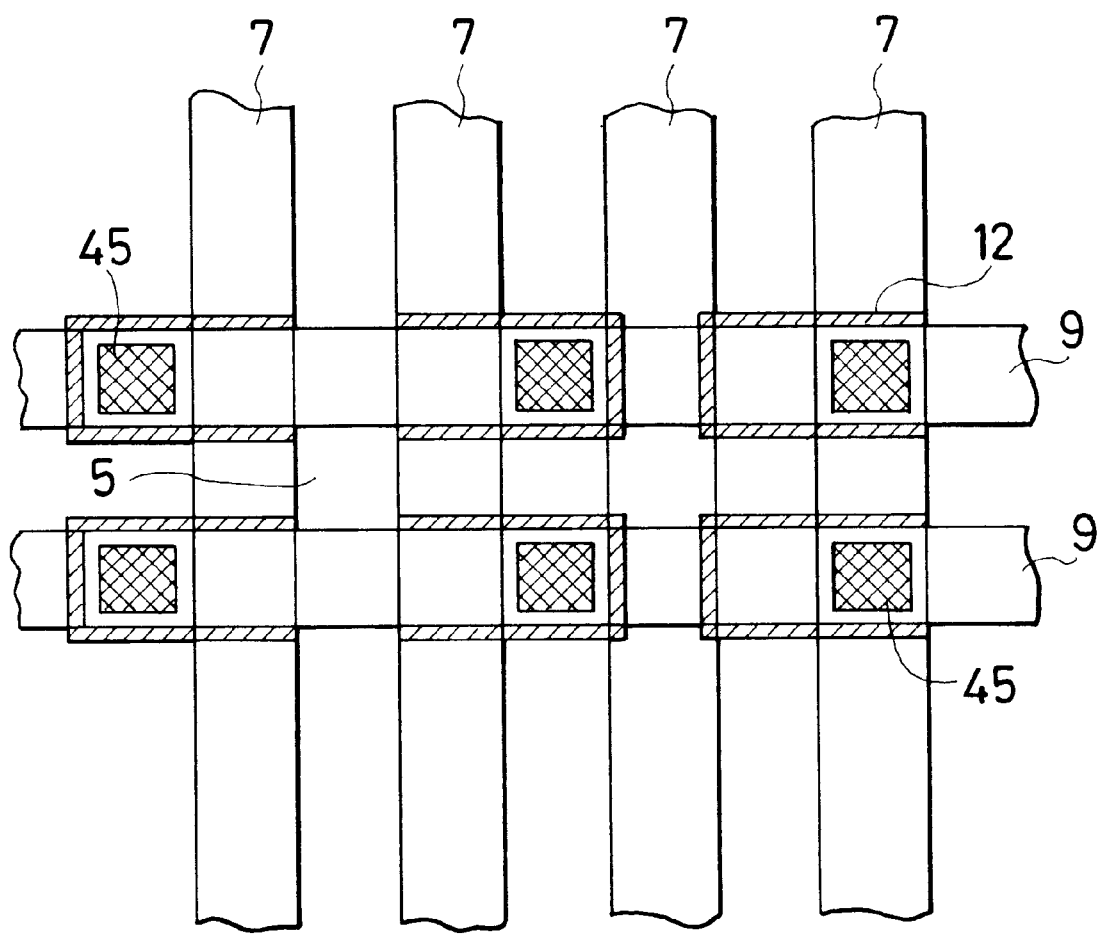
FIG. 6 is a top plan view of the memory cell array illustrated in FIGS. 4 and 5.

As illustrated in FIG. 5, a side wall 12 is formed at three sides of each of the device regions 2 only at an upper portion thereof except a side along which trench vertically extends. Under the side wall 12 is formed the n-type diffusion layer 3. The side wall 12 is composed of an oxide layer formed by CVD at high temperature and low pressure. The side wall 12 ensures that the periphery of each of the device regions 2 can be used as a capacitor electrode.

Figure 4:
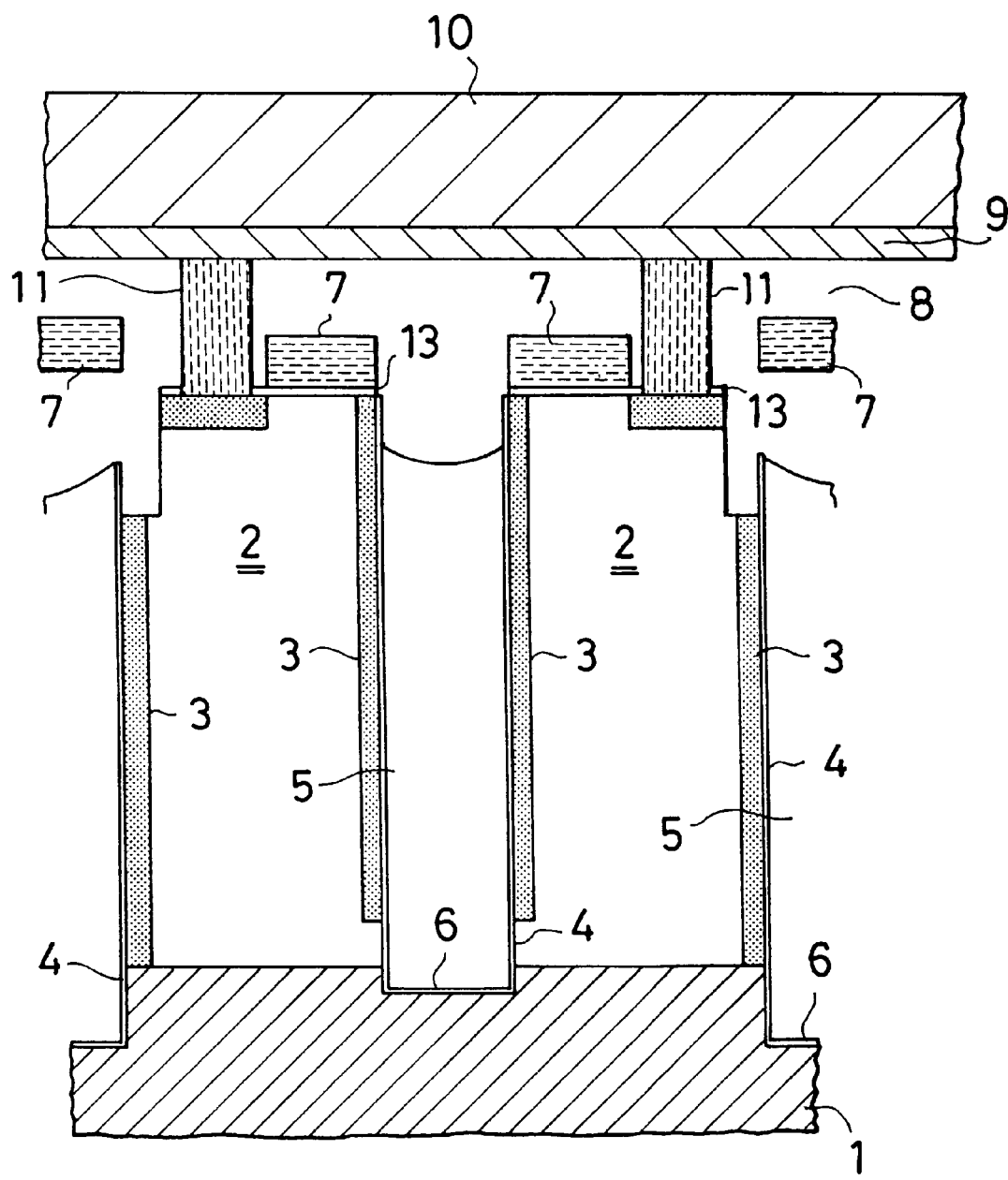
FIG. 4 is a cross-sectional view of a memory cell array in accordance with an embodiment of the invention.

As illustrated in FIG. 4, along an inner side wall of each of the trenches is deposited a capacitor insulating film 4. A space defined by the capacitor insulating film 4 is filled with a plate electrode 5, and an oxide film 19 on the plate electrode 5 (see FIG. 5). Below the bottom of each of the trenches is formed a p+diffusion layer 6 to isolate the capacitor electrode from adjacent ones. Thus, the n-type diffusion layer 3 is designed not to reach the p+ diffusion layer 6. It should be noted that the p+ diffusion layer 6 may be formed by using a p−/p+ epitaxial substrate in place of the p-type silicon substrate 1.

As illustrated in FIG. 4, over the device regions 2 and the trenches is deposited an interlayer oxide film 8, on which a plurality of bit lines 9 extend. Each of the bit lines 9 is connected with the associated diffusion layer of the memory cell transistor through a contact plug 11 extending through the interlayer oxide film 8 and the gate oxide layer 13. The bit lines 9 and the interlayer oxide film 8 are covered with an interlayer insulating film 10 for the purpose of surface protection.

Figure 7A:
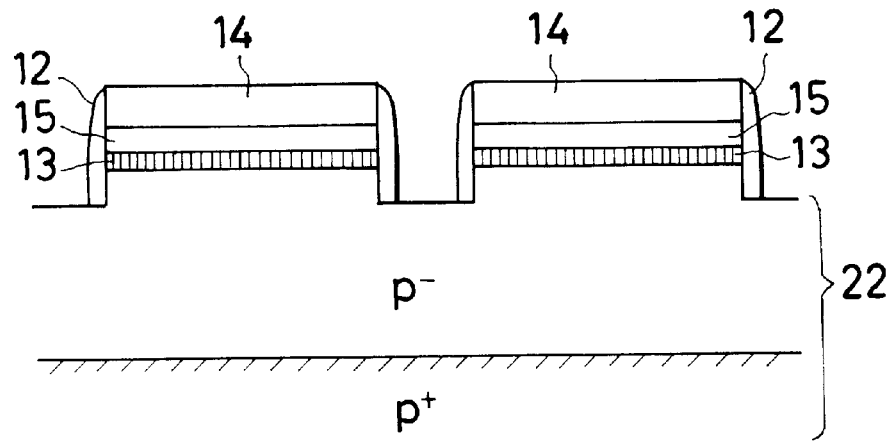
FIGS. 7A to 7E are cross-sectional views of an element in relative steps of a method for fabricating the semiconductor device in accordance with the invention.

Hereinbelow is explained a method for fabricating the above mentioned semiconductor device with reference to FIGS. 7A to 7E. First, as illustrated in FIG. 7A, on a p−/p+ epitaxial silicon substrate 22, including a p− region of about 2.5 μm thickness on a p+ region are deposited the gate oxide layer 13 of about 8 nm thickness, a mask oxide layer 14, and a gate polysilicon layer 15 in this order. Then, the layers 13, 14, 15 are patterned to thereby form an etching mask. Then, using the etching mask, the p−/p+ epitaxial silicon substrate 22 is dry etched by a depth of 0.3 to 0.5 μm to thereby form two bit silicon islands. Then, around each of the silicon islands is formed the side wall 12 composed of an oxide film and having a thickness in the range of 30 to 50 nm by means of etching back.

Figure 7B:
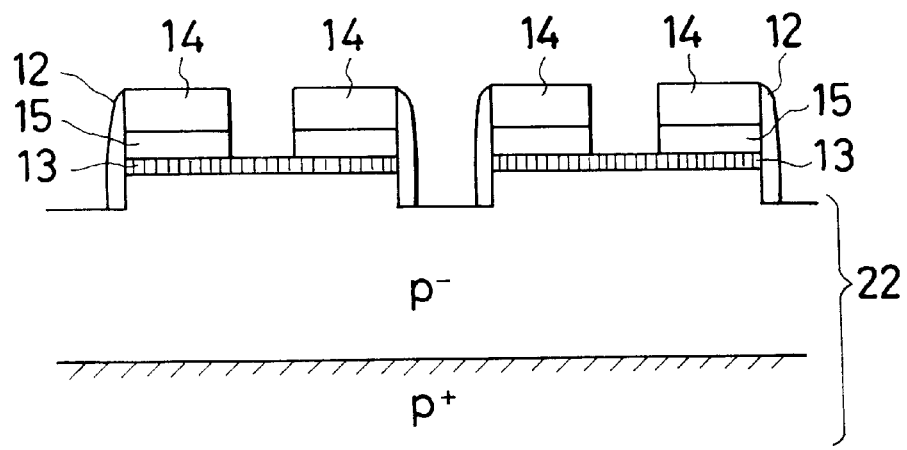

Next, as illustrated in FIG. 7B, a central portion of each of the two bit 30 silicon islands are removed by dry etching. Thus, only a central portion of the side wall 12 and the etching mask composed of the mask oxide layer 14 and the gate polysilicon layer 15 is removed.

Figure 7C:
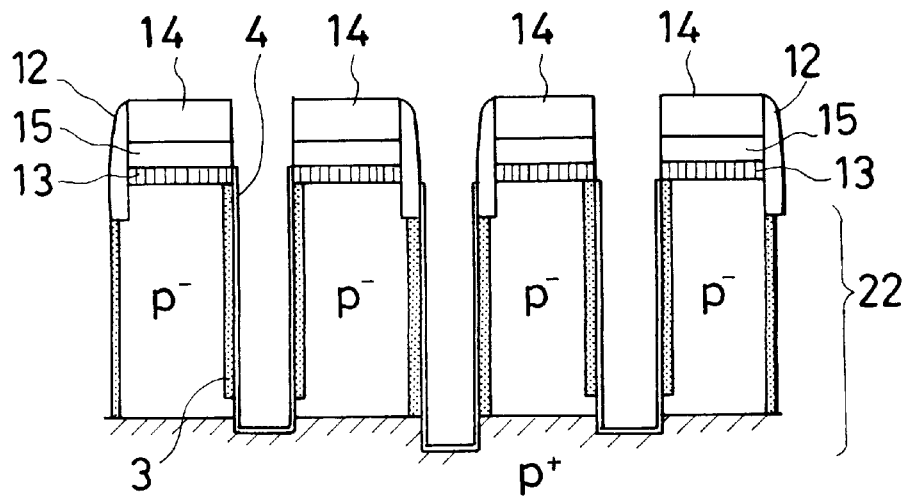

Then, the Si substrate 22 is dry etched by using the thus formed etching mask pattern 14, 15 and the side wall 12 as a mask, to thereby form a plurality of one bit device regions, as illustrated in FIG. 7C. Thereinafter, As ions are obliquely implanted to a periphery of each of the device regions to thereby form the n-type diffusion layer 3.

In addition, as illustrated in FIG. 7C, after the oblique As ion implantation, the Si substrate 22 is further dry etched until the p+ region thereof is exposed. Thus, the p+ diffusion layer 6 is formed. Then, the capacitor insulating film 4 such as an oxide nitride layer is deposited along an inner side wall of each of the trenches.

Figure 7D:
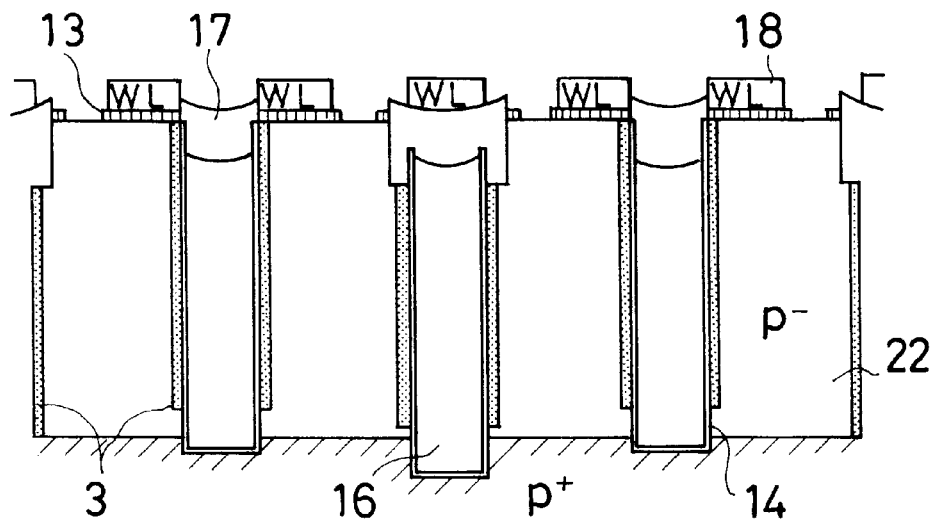

Then, as illustrated in FIG. 7D, the space around each of the device regions 2 is filled with plate polysilicon 16 and an oxide film 17 by etching back. When the oxide film 17 is etched back, the mask oxide film 14 and gate polysilicon layer 15 are also removed. Then, on the gate oxide film 13 is deposited a low resistive material such as WSi for forming a word line, which is subsequently patterned by dry etching to form polycide word lines 18 having a thickness of approximately 200 nm on the gate oxide film 13. It should be noted that the plate polysilicon 16, the oxide film 17, and the polycide word line 18 correspond to the plate electrode 5, the oxide film 19, and the word line 7, each illustrated in FIGS. 4 to 6, respectively.

Figure 7E:
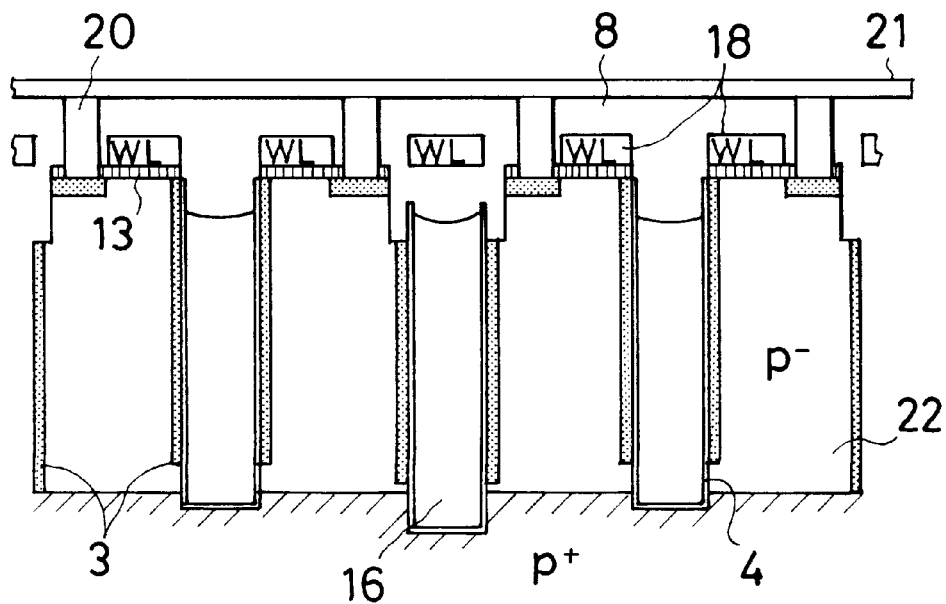

Then, as illustrated in FIG. 7E, the interlayer insulating film 8 is deposited over a resultant, and is flattened. Then, bit contacts 45 (see FIG. 6) are opened through the interlayer insulating film 8, and are subsequently filled with polysilicon to form polysilicon contact plugs 20. Thereafter, a plurality of silicide bit lines 21 are patterned on the interlayer insulating film 8 so that each of the bit lines 21 is connected with the associated diffusion layer of each of the device regions through the polysilicon contact plug 20. Herein, the polysilicon contact plug 20 and the silicide bit line 21 correspond to the contact plug 11 and the bit line 9 each illustrated in FIGS. 4 and 5, respectively.

Then, as illustrated in FIG. 4, the silicide bit lines 21 and the interlayer oxide layer 8 are covered with the interlayer insulating film 10 for surface protection. Thereinafter, a metallization process is carried out in the same way as in an ordinary DRAM fabrication process.

In the semiconductor device of the embodiment, the gate oxide film 13 serving as a gate insulating film and the word line 7 serving as a gate electrode of a switching transistor are stacked in this order on the substrate perpendicularly to the substrate so that they are disposed on an exposed portion of the n-type diffusion layer 3, serving as a diffusion capacitor electrode, formed along an inner side wall of a trench formed in the p-type silicon substrate 1. Accordingly, it is not necessary to have an area, or a contact, for connecting the switching transistor with the n-type diffusion layer 3 therethrough.

Thus, a vertically arranged transistor in which impurities profile control and gate oxide film thickness profile control is difficult is not used, yet it is possible to obtain a small memory cell whose area is at least as small as that of the vertically arranged transistor. The minimum cell area of the semiconductor device of the embodiment is $6F^2$ wherein F represents a design rule, since the contact plug 11 serving as a bit line contact is formed per one bit of the memory cell. If the contact plug 11 is formed per two bits, the minimum cell area is $4F^2$.

Figure 8:
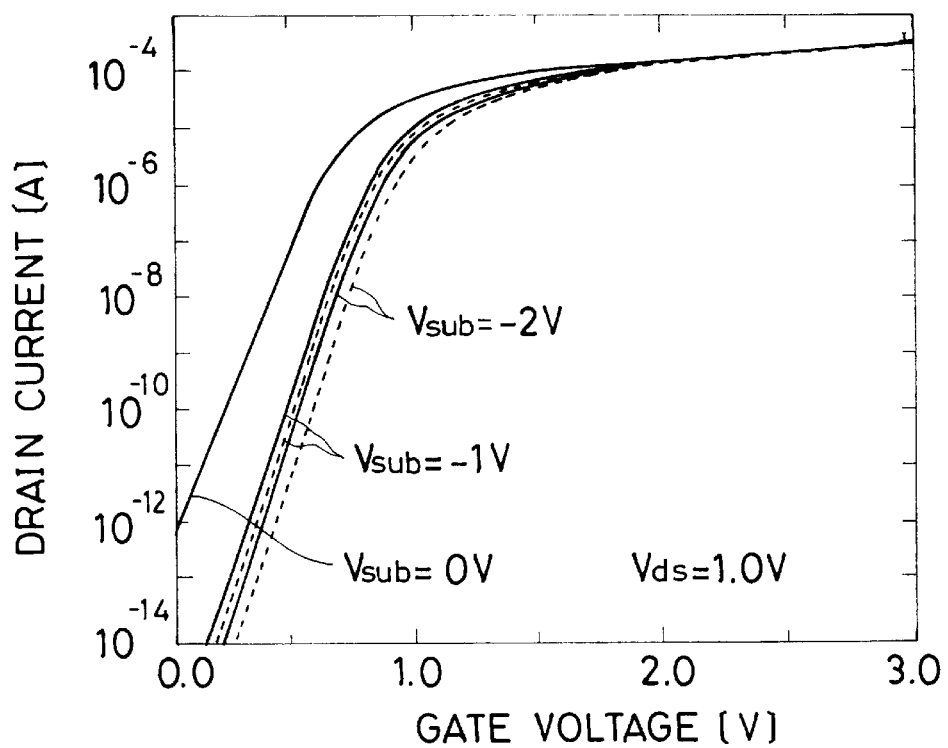
FIG. 8 is a graph showing the subthreshold characteristics of an embodiment of the invention.

The embodiment ensures that an electric field acting on the gate insulating film can be reduced relative to an ordinary flat type transistor. The reason for this will be explained hereinbelow with reference to FIGS. 8 and 9. FIG. 8 shows subthreshold characteristics of the transistor of the memory cell illustrated in FIG. 4, obtained through device simulation.

A transistor (n-type) specification is assumed as follows. The gate electrode is phosphorus-doped polysilicon having a gate length of 0.25 $\mu$m and a gate width of 1 $\mu$m. The gate oxide layer has a thickness of 8 nm. A diffusion layer disposed in the vicinity of the capacitor electrode is formed under the conditions of 70 KeV of implantation energy, $1 \times 10^{15}$ cm$^{-2}$ of dose, and an oblique As implantation single drain with an incident angle of 6 degrees with respect to the vertical direction, while the diffusion layer disposed at the bit contact is formed through an oxide film side wall having a thickness of 30 nm under the conditions of 70 KeV of implantation energy, $5 \times 10^{13}$ cm$^{-2}$ of dose, and As implantation LDD. The LDD side wall is 100 nm thick.

The p-type substrate has a concentration of $1 \times 10^{17}$ cm$^{-3}$. Channel implantation conditions are as follows: 20 KeV of implantation energy, $3 \times 10^{12}$ cm$^{-2}$ of dose, and boron (B) implantation. The plate electrode 5 is filled in the trench up to an elevation 0.3 $\mu$m below the surface of the substrate. Heat treatment is carried out at 850 degrees centigrade for 30 minutes.

Figure 9:
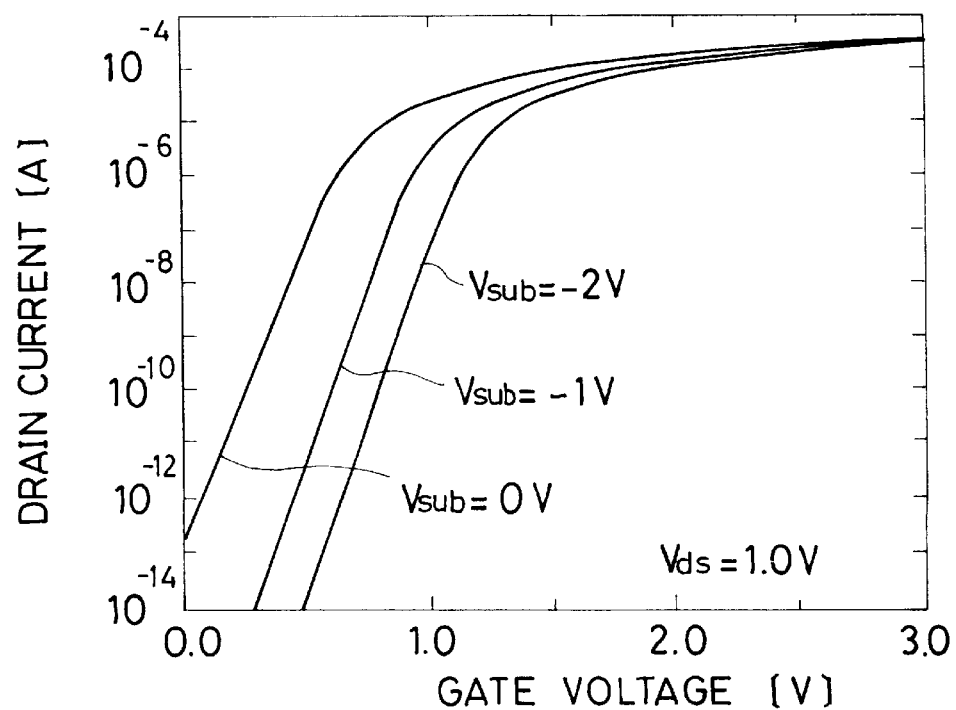
FIG. 9 is a graph showing the subthreshold characteristics of an ordinary LLD transistor.

In FIG. 8, solid lines show the device characteristics when a current flows from the capacitor electrode to the bit contact, while broken lines show the device characteristics when a current flows from the bit contact to the capacitor electrode. The ordinate axis represents a drain current, while the abscissa axis represents a gate voltage. The voltage Vds between drain and source is designed to be 1.0 V. FIG. 8 shows three cases in which a voltage between the substrate and the source is 0 V, −1 V, and −2 V, respectively. Herein, among the two diffusion layers, a terminal of the diffusion layer to which a reference potential is to be applied is called a source. In FIGS. 8 and 9, Vsub means a difference in voltage between the substrate and the source, and Vds means a difference in voltage between the drain and the source.

For comparison, FIG. 9 shows subthreshold characteristics of the diffusion layer disposed in the vicinity of the bit contact when the diffusion layer is a flat type structure symmetrical about a gate, or an ordinary LDD structure. In FIG. 9, the ordinate axis represents drain current, while the abscissa axis represents gate voltage. A voltage Vds between drain and source is designed to be 1.0 V. Similarly to FIG. 8, FIG. 9 shows three cases in which a voltage Vsub between the substrate and the source is 0 V, −1 V, and −2 V, respectively. Herein, among the two diffusion layers, a terminal of the diffusion layer to which a reference potential is to be applied is called a source.

As is obvious from FIGS. 8 and 9, when Vsub is 0 V, the drain current vs. gate voltage curves and the threshold voltages are almost equal to each other in FIGS. 8 and 9. However, as Vsub, namely the voltage difference between the substrate and the source, increases in a negative direction, the dependency of the threshold voltage on Vsub is remarkably reduced in FIG. 8.

Such characteristics are exhibited because the vertically arranged structure of the diffusion layer is disposed close to the capacitor electrode. When the voltage difference Vsub between the substrate and the source is increased in a negative direction, the threshold voltage is first raised due to a division effect by which the capacitor below the gate electrode is divided. Since the potential profile in the vicinity of a vertically arranged diffusion layer is in parallel with the vertically arranged diffusion layer or perpendicular to the channel of the transistor, as the reference potential is increased in a negative direction, a depletion layer extends towards the channel with the result that the effective channel length is shortened and drain current is increased. Thus, the threshold voltage is decreased. Accordingly, as the voltage difference Vsub between the substrate and the source is increased in a negative direction, the above mentioned two effects are canceled by each other, and thus the dependency of the threshold voltage on Vsub is decreased more rapidly than an ordinary flat type transistor.

For the above mentioned reasons, the embodiment ensures that the dependency of the threshold voltage on a substrate voltage is made much smaller than in a transistor having an ordinary structure, as shown in FIGS. 8 and 9, provided that Vsub is set to be −1 V.

When data is to be written to a DRAM memory cell, the gate voltage is in general determined to include an increment of a threshold voltage caused by voltage increase in a capacitor electrode or Vsub increase in a memory cell transistor, in order to perfectly write data into the memory cell. Accordingly, the smaller dependency of a threshold voltage on Vsub ensures a smaller gate voltage, resulting in the electric field acting on the gate insulating film being reduced. As mentioned earlier, the memory cell transistor in accordance with the embodiment has a smaller dependency of the threshold voltage on Vsub, and hence is improved over prior art memory cells with respect to life span and reliability of the gate oxide film.

It should be noted that the scope of the invention is not to be limited to the above mentioned embodiment. For instance, a p-type bulk substrate may be substituted for the p−/p+ epitaxial substrate 22, in which case, the p+ diffusion layer 6 can be formed by implanting boron ions to the bottom of a trench formed in the bulk substrate.

In the embodiment, though the n-type diffusion layer 3 is formed on the p-type Si substrate, a p-type diffusion layer may be formed on an n-type Si substrate.

As described, in the semiconductor device according to the invention, there is no area, or capacitor contact, through which the second conductivity type diffusion layer serving as a capacitor electrode is in contact with the switching transistor. A vertically arranged transistor in which impurities profile control and gate oxide film thickness profile control is difficult is not used, yet, it is possible to obtain a memory cell area which is at least as small as that of the vertically arranged transistor.

In addition, the second conductivity type diffusion layer also serves as the source of the memory cell transistor, and hence it is not necessary to form capacitor contact windows. Thus, it is not necessary to carry out accurate alignment in a lithography step, and furthermore, all of the device region can be used as a cell capacitor. For this reason, the channel impurities profile and gate oxide film thickness is easier to control, and in addition, it is possible to control the reference voltage of the memory cell transistor. Furthermore, the invention ensures that the nonuniformity of the gate oxide film thickness does not occur, without degradation of the substrate flatness by which a trench capacitor cell is characterized.

In the semiconductor device according to the invention, a diffusion layer disposed close to a capacitor cell is structured in a vertical arrangement. This structure ensures a smaller gate voltage than an ordinary flat type transistor to thereby reduce the electric field acting on the gate insulating film, resulting in enhancement of the life span and reliability of the gate oxide film.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor device comprising:
    a first conductivity type semiconductor substrate having a plurality of trenches formed therein, said trenches defining a plurality of device regions between adjacent trenches;
    a second conductivity type diffusion layer formed at an outer surface of each of said device regions, said diffusion layer vertically extending at least to the proximity of a bottom of each of said trenches, and vertically extending to an uppermost surface of said substrate;
    an insulating film formed on said inner surface of each of said trenches to cover at least a part of said second conductivity type diffusion layer therewith;
    a plate electrode formed within each of said trenches, said plate electrode having an upper surface level with or lower than an upper edge of said trenches;
    a gate electrode formed above said second conductivity type diffusion layer so that said gate electrode entirely covers a region at which said second conductivity type diffusion layer reaches said uppermost surface of said semiconductor substrate; and
    a gate insulating film interposed between said gate electrode and said second conductivity type diffusion layer to isolate said gate electrode from said second conductivity type diffusion layer, said gate insulating film entirely covering said region at which said second conductivity type diffusion layer reaches said uppermost surface of said semiconductor substrate;
    wherein one of said device regions, said second conductivity type diffusion layer, and said gate electrode form a transistor having a horizontal channel in said one of said device regions.

2. The semiconductor device as recited in claim 1, wherein said first conductivity type semiconductor substrate includes a heavily doped portion at the bottom thereof, said second conductivity type diffusion layer extending short of said heavily doped portion of said first conductivity type diffusion substrate.

3. The semiconductor device as recited in claim 2, wherein said first conductivity type semiconductor substrate is one of n−/n+ and p−/p+ epitaxial substrates.

4. The semiconductor device as recited in claim 1 further comprising an oxide layer formed around an outer surface of each of said device regions at an upper portion thereof except a side on which said insulating film is formed.

5. A semiconductor device for use in a semiconductor memory, said semiconductor device comprising:
    a first conductivity types semiconductor substrate having a plurality of trenches formed therein, said trenches defining a plurality of device regions between adjacent trenches;
    a second conductivity type diffusion layer formed at an outer surface of each of said device regions, one end of said second conductivity type diffusion layer reaching an uppermost surface of said first conductivity type semiconductor substrate and the other end vertically extending at least to the proximity of a bottom of each of said trenches;
    an insulating film formed on an inner surface of each of said trenches to cover at least a part of said second conductivity type diffusion layer therewith;
    a plate electrode formed within each of said trenches, said plate electrode having an upper surface level with or lower than an upper edge of said trenches;
    a plurality of word lines each of which is formed above said second conductivity type diffusion layer so that each said word line entirely covers said end of said second conductivity type diffusion layer reaching said uppermost surface of said semiconductor substrate;
    a gate insulating film interposed between said word line and said second conductivity type diffusion layer to isolate said word line from said second conductivity type diffusion layer, said gate insulating film entirely covering said end of said second conductivity type diffusion layer reaches said uppermost surface of said semiconductor substrate;
    a plurality of bit lines extending in a cross-direction to said word lines; and
    a plurality of contact plugs each of which connects each of said bit lines to an associated one of said second conductivity type diffusion layers of said device regions;
    wherein one of said device regions, said second conductivity type diffusion layer, and one of said word lines form a transistor having a horizontal channel in said one of said device regions.

6. The semiconductor device as recited in claim 5 further comprising an oxide layer deposited on said plate electrode within each of said trenches.

7. The semiconductor device as recited in claim 5, wherein said first conductivity type semiconductor substrate includes a heavily doped portion at the bottom thereof, said second conductivity type diffusion layer extending short of said heavily doped portion.

8. The semiconductor device as recited in claim 7, wherein said first conductivity type semiconductor substrate is one of n−/n+ and p−/p+ epitaxial substrates.

9. The semiconductor device as recited in claim 5 further comprising an oxide layer formed around an outer surface of each of said device regions at an upper portion thereof except a side on which said insulating film is formed.

* * * * *